(12) United States Patent
Yamaguchi et al.

(10) Patent No.: US 6,927,347 B2
(45) Date of Patent: Aug. 9, 2005

(54) PRINTED CIRCUIT BOARD HAVING THROUGH-HOLE PROTECTED BY BARRIER AND METHOD OF MANUFACTURING THE SAME

(75) Inventors: Atsushi Yamaguchi, Kariya (JP); Hidehiko Kumazawa, Nisshin (JP)

(73) Assignee: Denso Corporation, Kariya (JP)

( * ) Notice: Subject to any disclaimer, the term of this patent is extended or adjusted under 35 U.S.C. 154(b) by 32 days.

(21) Appl. No.: 10/396,454

(22) Filed: Mar. 26, 2003

(65) Prior Publication Data

US 2003/0192716 A1 Oct. 16, 2003

(30) Foreign Application Priority Data

Apr. 10, 2002 (JP) ........................................ 2002-107728

(51) Int. Cl.[7] ............................. H05K 1/16; H05K 7/02; H01K 23/48
(52) U.S. Cl. ........................ 174/260; 257/773; 361/777
(58) Field of Search .............................. 257/773, 698, 257/787; 174/260, 262–266; 361/760, 767, 768, 771, 777, 778; 29/841; 438/126, 127

(56) References Cited

U.S. PATENT DOCUMENTS

| | | | | |
|---|---|---|---|---|
| 3,885,304 A | * | 5/1975 | Kaiser et al. ................. | 29/832 |
| 4,729,061 A | * | 3/1988 | Brown ........................ | 361/719 |
| 4,767,892 A | * | 8/1988 | Kobari ........................ | 174/256 |
| 5,173,766 A | * | 12/1992 | Long et al. .................. | 257/687 |
| 5,220,487 A | * | 6/1993 | Patel et al. .................. | 361/708 |
| 5,436,203 A | * | 7/1995 | Lin .............................. | 29/841 |
| 5,637,835 A | * | 6/1997 | Matern ........................ | 174/266 |
| 5,831,833 A | * | 11/1998 | Shirakawa et al. .......... | 361/762 |
| 5,925,445 A | * | 7/1999 | Suzuki ........................ | 428/209 |
| 6,248,961 B1 | * | 6/2001 | Enroth et al. ................ | 174/265 |
| 6,291,777 B1 | * | 9/2001 | Burkhart et al. ............. | 174/262 |

* cited by examiner

Primary Examiner—Alonzo Chambliss
(74) Attorney, Agent, or Firm—Posz Law Group, PLC

(57) ABSTRACT

A through-hole formed in a printed circuit board is prevented from being contaminated with water-resistant liquid coated on circuit elements. To prevent the water-resistant liquid from flowing into the through-hole, a barrier such as a bank surrounding the through-hole is formed in a screen-printing process for printing other patterns on the circuit board. The barrier is easily and precisely formed in a space between the through-hole and the circuit elements coated with the water-resistant liquid without requiring an additional manufacturing cost. The through-hole is reliably protected against the water-resistant liquid, while eliminating a conventional process of masking the through-hole.

3 Claims, 5 Drawing Sheets

PRINTED CIRCUIT BOARD HAVING THROUGH-HOLE PROTECTED BY BARRIER AND METHOD OF MANUFACTURING THE SAME

CROSS-REFERENCE TO RELATED APPLICATION

This application is based upon and claims benefit of priority of Japanese Patent Application No. 2002-107728 filed on Apr. 10, 2002, the content of which is incorporated herein by reference.

BACKGROUND OF THE INVENTION

1. Field of the Invention

The present invention relates to a printed circuit board on which various circuit elements are mounted and to a method of manufacturing such a printed circuit board.

2. Description of Related Art

In a process of manufacturing a conventional printed circuit board that includes a through-hole positioned near a circuit element, an opening area of the through-hole is covered with a masking tape or the like before dampproof liquid is coated on the circuit element in order to prevent the dampproof liquid from flowing into the through-hole. The process of covering the opening area of the through-hole is referred to as a masking process. Since some of the circuit elements have to be protected from moisture or water, the dampproof liquid is coated thereon after such circuit elements are mounted on a substrate. However, the dampproof liquid coated on the circuit elements flows into the through-hole formed near the circuit elements, contaminating the through-hole with the dampproof liquid, if the through-hole is not covered by the masking tape or the like.

A lead wire or a terminal pin is inserted into the through-hole having a metal-plated inner bore and soldered to the inner bore or electrically connected thereto without soldering. If the through-hole is contaminated with the dampproof liquid, the electrical connection in the through-hole may be damaged. To prevent the dampproof liquid from flowing into the through-hole, the area around the opening of the through-hole is covered with the masking tape or the like in the conventional process of manufacturing the printed circuit board. However, positioning the masking tape precisely in a required area is not easy because the circuit elements and the through-hole are usually positioned close to one another. Although the masking tape may be automatically placed by an automatic machine, it is difficult to eliminate small positioning errors in a range of 1 mm. It may be possible to exactly position the masking tape by using an expensive and sophisticated positioning machine. However, employing such a sophisticated machine in the masking process would not be justified from a view point of a manufacturing cost.

SUMMARY OF THE INVENTION

The present invention has been made in view of the above-mentioned problem, and an object of the present invention is to provide an improved printed circuit board in which the through-hole is properly protected from the dampproof liquid without using the masking tape or the like. Another object of the present invention is to provide a method of manufacturing such a printed circuit board, in which the conventional masking process is eliminated.

The printed circuit board is composed of a substrate having electrical circuits printed thereon and circuit elements mounted on the substrate. The circuit board includes a through-hole, into which a lead wire or a bolt is inserted and electrically connected thereto after the circuit board is completed, and circuit elements coated with dampproof liquid which are positioned a small space apart from the through-hole. To prevent the dampproof liquid from flowing into the through-hole, a barrier is formed in the space between the circuit element coated with the dampproof liquid and the through-hole. If the through-hole is contaminated with the dampproof liquid, electrical connections in the through-hole would be damaged.

The barrier may be formed in a circular bank or banks surrounding the through-hole. In a case where two circular banks are formed to coaxially surround the through-hole, a space is provided between an inner bank and an outer bank. If the dampproof liquid flows over an inner bank, the dampproof liquid is retained in the space between two banks. An opening or openings may be made in the outer circular bank so that the dampproof liquid retained in the space is discharged through the openings. The barrier may be made in a form of a protecting zone disposed in the space between the circuit element coated with the dampproof liquid and the through-hole. The protecting zone is made of a material shedding the dampproof liquid.

The printed circuit board is manufactured in the following manner. The substrate on which electrical circuits are printed is prepared. The barrier is formed on the substrate together with other patterns in a single screen-printing process with a material such as ink paste. Then, the circuit elements are mounted on the substrate. Finally, the circuit elements are coated with the dampproof liquid.

According to the present invention, the barrier surely prevents the dampproof liquid from flowing into the through-hole. Since the barrier is formed together with other patterns by screen-printing, no additional manufacturing cost for forming the barrier is required. The conventional process of masking the through-hole is eliminated. Further, the barrier can be precisely positioned at a required position, thereby effectively utilizing a limited mounting space of the circuit board.

Other objects and features of the present invention will become more readily apparent from a better understanding of the preferred embodiment described below with reference to the following drawings.

DETAILED DESCRIPTION OF THE PREFERRED EMBODIMENT

Figure 4:
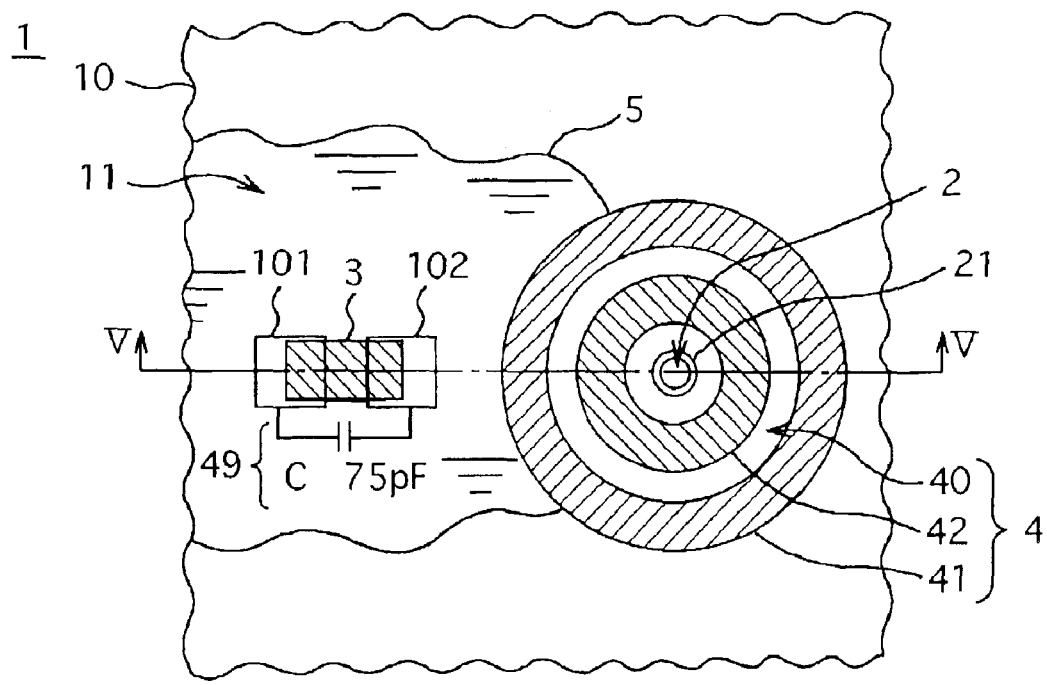
FIG. 4 is a plan view showing the substrate on which dampproof liquid covering the chip-capacitor is coated.
Figure 5:
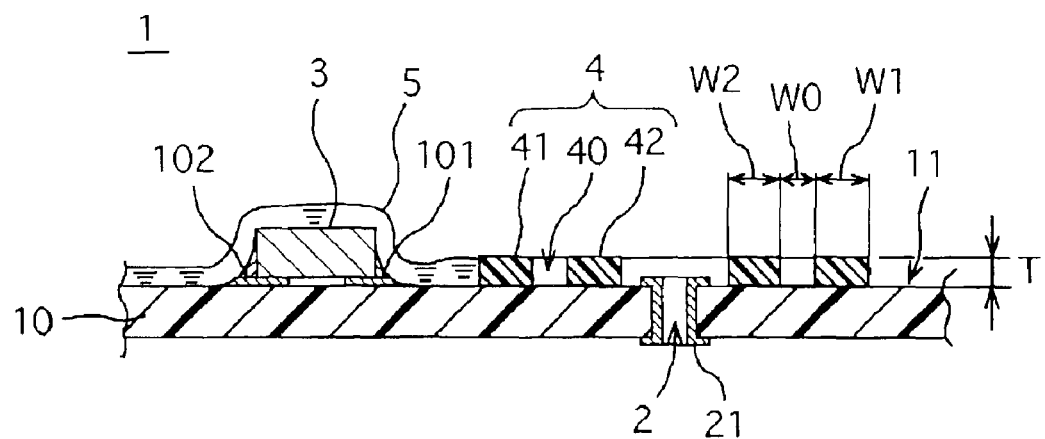
FIG. 5 is a cross-sectional view showing the substrate, taken along line V—V shown in FIG. 4.

A preferred embodiment of the present invention will be described with reference to FIGS. 1–6. First, a manufacturing process of a printed circuit board according to the present invention will be described. Then, a structure of the printed circuit board will be briefly described because the structure is easily understood based on its manufacturing process. FIGS. 1–4 sequentially show the process of manufacturing the printed circuit board 1, and FIG. 5 shows a cross-sectional view of the printed circuit board 1, taken along line V—V shown in FIG. 4. Those drawings only show a part of the printed circuit board 1 relevant to the present invention.

Figure 1:
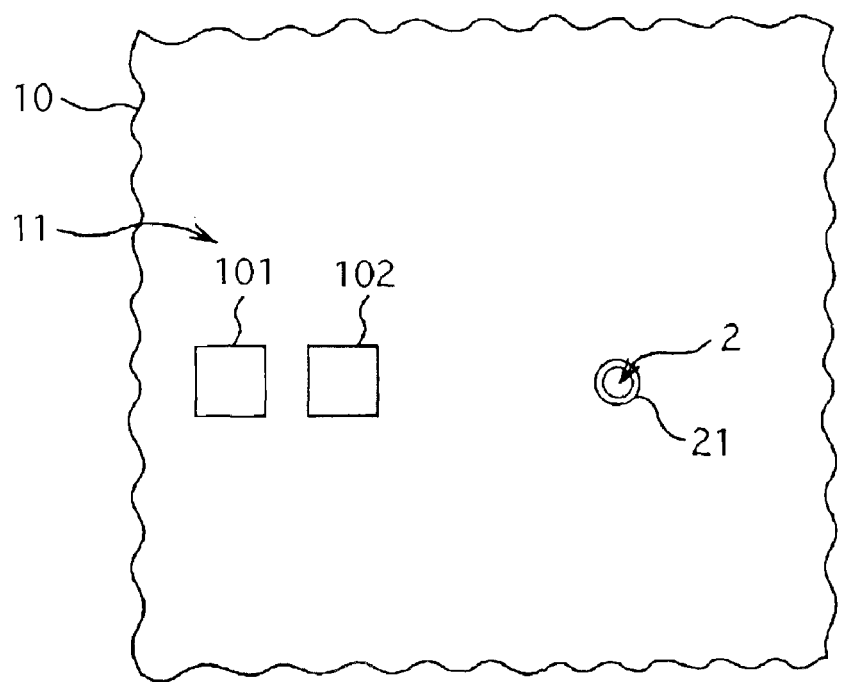
FIG. 1 is a plan view showing a part of a substrate constituting a printed circuit board according to the present invention.

The printed circuit board 1 is made by printing various circuits on both surfaces of a substrate 10 and mounting various circuit elements thereon. The printed circuit board 1 is manufactured in known processes except for processes of forming a barrier and applying dampproof liquid, which will be described below in detail. As shown in FIG. 1, a through-hole 2 is formed through the substrate 10, and a pair of copper pads 101, 102 is printed on a front surface 11 of the substrate 10. The substrate 10 is made of a board such as a glass-epoxy-resin compound board. An inside surface of the through-hole 2 and areas around its front and rear openings are plated with a metallic material 21, as shown in FIG. 4. The pair of pads 101, 102 is positioned with a predetermined space apart from the through-hole 2. The predetermined space is made relatively small to mount many circuit elements in a limited space of the substrate 10.

Figure 2:
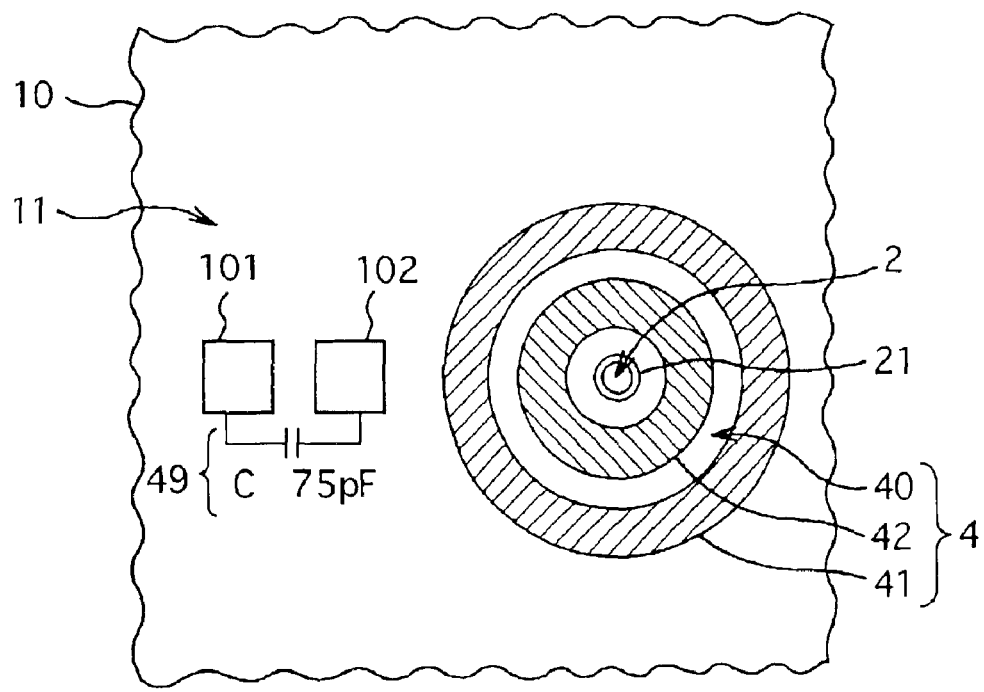
FIG. 2 is a plan view showing the substrate on which a barrier preventing dampproof liquid from flowing into a through-hole is formed.

As shown in FIG. 2, an outer circular bank 41 and an inner circular bank 42 surrounding the through-hole 2 are formed on the front surface 11 of the substrate 10. Those circular banks 41, 42 serve as a barrier 4 for preventing dampproof liquid or paste, which is coated in a later step on a circuit element to be connected to the pads 101 and 102, from flowing into the through-hole 2. The circular banks 41, 42 are printed by screen-printing together with other patterns including marks and characters 49 in a single process. The screen-printing is a known printing method, in which a silk screen having fine meshes is masked to leave desired patterns, and ink paste substantially composed of epoxy resin and white pigment is forcibly squeezed toward the silk screen. In this manner, the desired patterns and characters are simultaneously printed. The printed marks and characters 49 indicate a position where a 75-pF capacitor is to be connected.

The circular banks 41, 42 are formed coaxially with each other to surround the through-hole 2. As shown in FIG. 5, a space 40 having a width W0 is formed between the pair of circular banks 41, 42. A height of the circular banks 41, 42 is T, which is equal to a height of the printed ink paste. A width of the outer circular bank 41 is W1, and a width of the inner circular bank 42 is W2. Those dimensions W0, W1 and W2 are determined according to a viscosity of the dampproof liquid, wettability of the front surface 11 of the substrate 10 and other factors in designing the printed circuit board.

Figure 3:
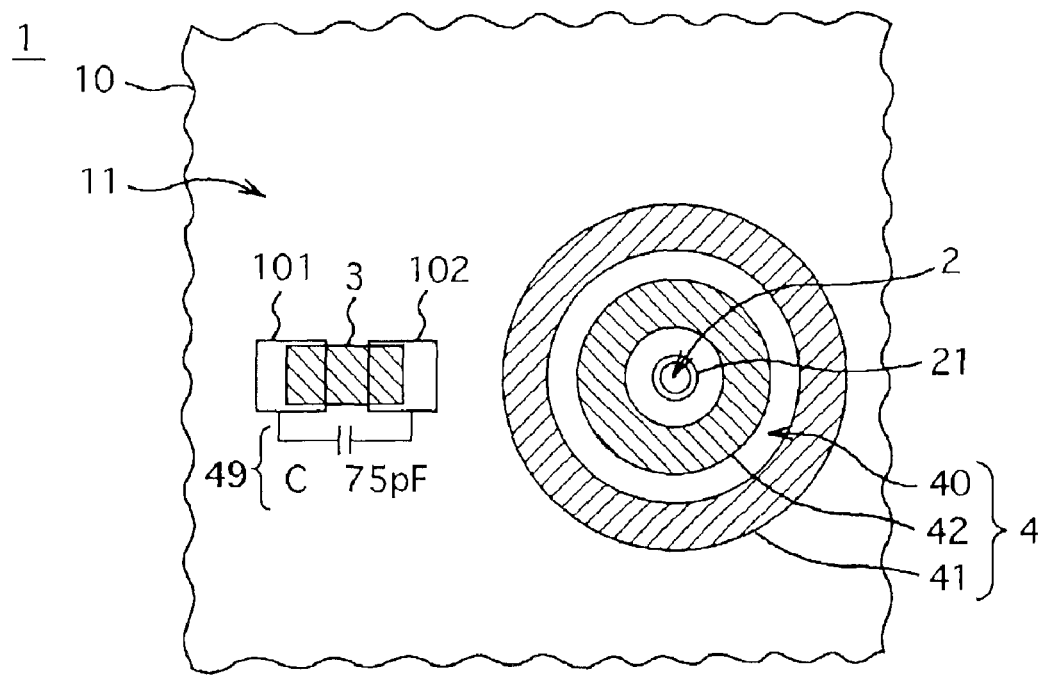
FIG. 3 is a plan view showing the substrate on which a chip-capacitor is mounted.

Then, as shown in FIG. 3, a chip-capacitor 3 is mounted on the pads 101, 102 and electrically connected thereto by soldering. Other circuit components are similarly mounted on the substrate 10, thereby forming the printed circuit board 1. Then, as shown in FIG. 4, the chip-capacitor 3 and other circuit elements (not shown) are covered with the dampproof liquid (or paste) 5 in order to protect the chip-capacitor and other circuit elements from moisture or water. Since a viscosity of the dampproof liquid 5 is low, it spreads on the front surface 11 of the substrate 10, as shown in FIG. 5, and it may reach an outer periphery of the outer circular bank 41. The flow of the dampproof liquid 5 is stopped by the outer circular bank 41, and the through-hole 2 is prevented from being contaminated with the dampproof liquid 5.

Figure 6:
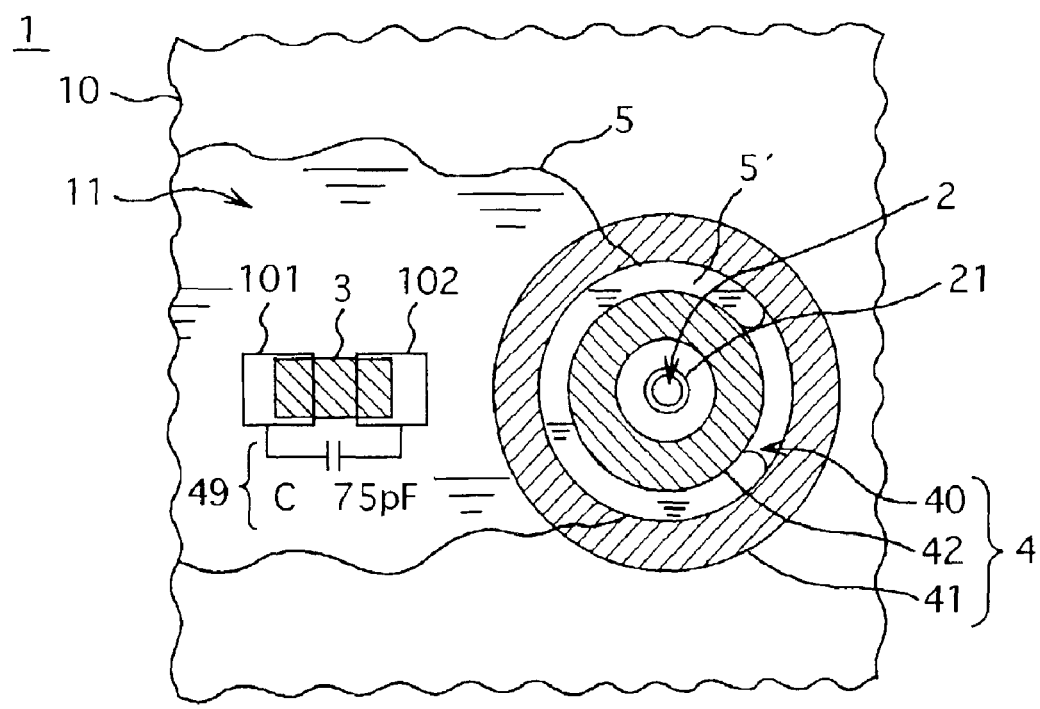
FIG. 6 is a plan view showing a situation where the dampproof liquid has flowed into a space between two circular banks surrounding the through-hole.

If a too much amount of the dampproof liquid 5 is applied to the elements, some of the dampproof liquid 5 may overflow beyond the outer circular bank 41, as shown in FIG. 6. Even in this case, overflowed dampproof liquid 5' is retained in the space 40 between two circular banks 41, 42 and prevented from flowing into the through-hole 2. It is almost impossible for the dampproof liquid 5 to further overflow beyond the inner circular bank 42.

As described above, the barrier 4 having double circular banks 41, 42 and the space 40 effectively prevents the dampproof liquid 5 from flowing into the through-hole 2. Since the barrier 4 is printed by screen-printing together with other printed patterns, no additional process is required for forming the barrier 4, and the conventional process for masking the through-hole 2 is eliminated. In addition, since the barrier 4 can be precisely positioned, a substrate space for mounting the various circuit elements is effectively utilized.

The structure of the printed circuit board 1 will be briefly described with reference to FIGS. 4 and 5. The printed circuit board 1 according to the present invention includes the substrate 10 in which the through-hole 2 is formed and circuit elements including the chip-capacitor 3 mounted on the substrate 10. The chip-capacitor 3 is positioned near the through-hole 2 with a predetermined space apart from the through-hole 2. The dampproof liquid or paste 5, which is in a liquid state at least when it is coated on the circuit elements, is coated on the circuit elements.

The barrier 4 including the double circular banks 41, 42 and the space 40 between the double banks is formed to surround the through-hole 2. The barrier 4 prevents the dampproof liquid 5 from flowing into the through-hole 2, and thereby the through-hole 2 is protected from being contaminated with the dampproof liquid 5. The circular banks 41, 42 are made of the same ink paste with which other patterns are formed on the substrate 10. Further, the circular banks 41, 42 are printed together with the other patterns in a single screen-printing process.

Advantages attained in the foregoing embodiment are summarized as follows. The barrier 4 is easily formed in the same process of printing other patterns, thereby saving the manufacturing cost. The barrier 4 can be precisely positioned on the substrate 10 to thereby effectively utilize the mounting space of the substrate 10. The barrier 4 surely protects the through-hole 2 from contamination with the dampproof liquid 5. In addition, if the dampproof liquid 5 or other contaminating fluid such as electrolyte of other circuit elements flows out toward the through-hole 2 in a course of actual usage of the printed circuit board 1, the barrier 4 effectively protects the through-hole 2. Therefore, the electrical connection in the through-hole 2 can be properly protected from any damages.

Figure 7:
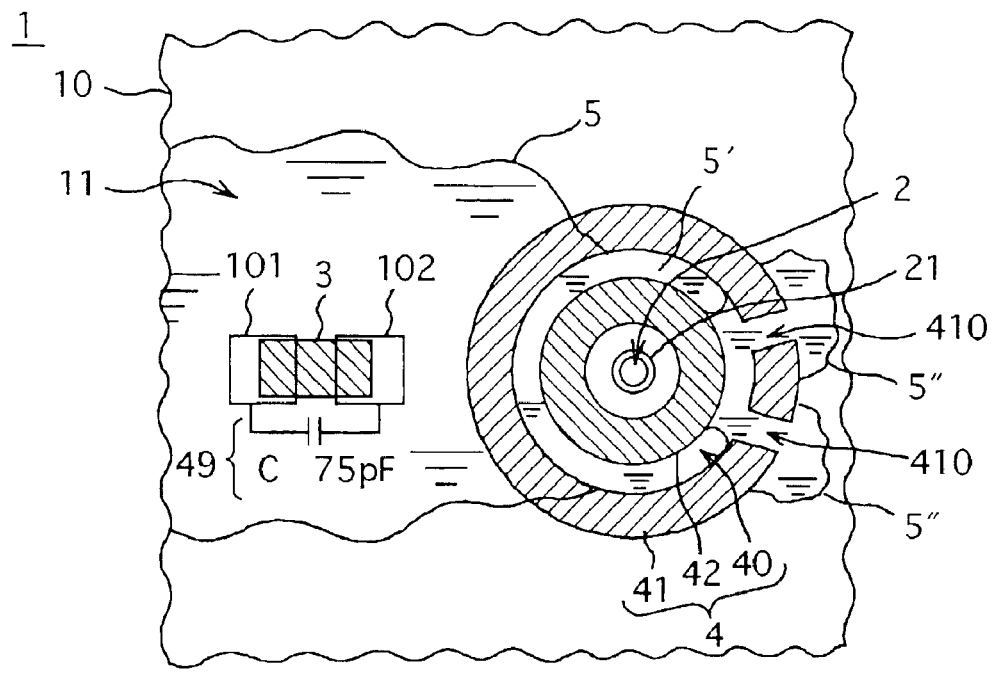
FIG. 7 is a plan view showing a first modified form of the barrier formed on the substrate.
Figure 8:
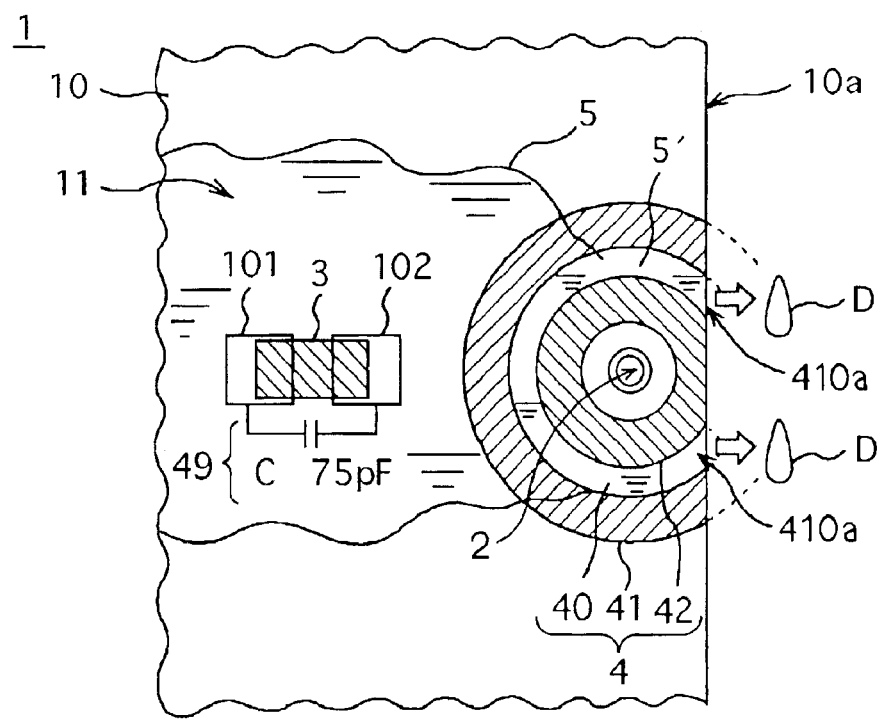
FIG. 8 is a plan view showing a second modified form of the barrier formed on the substrate.
Figure 9:
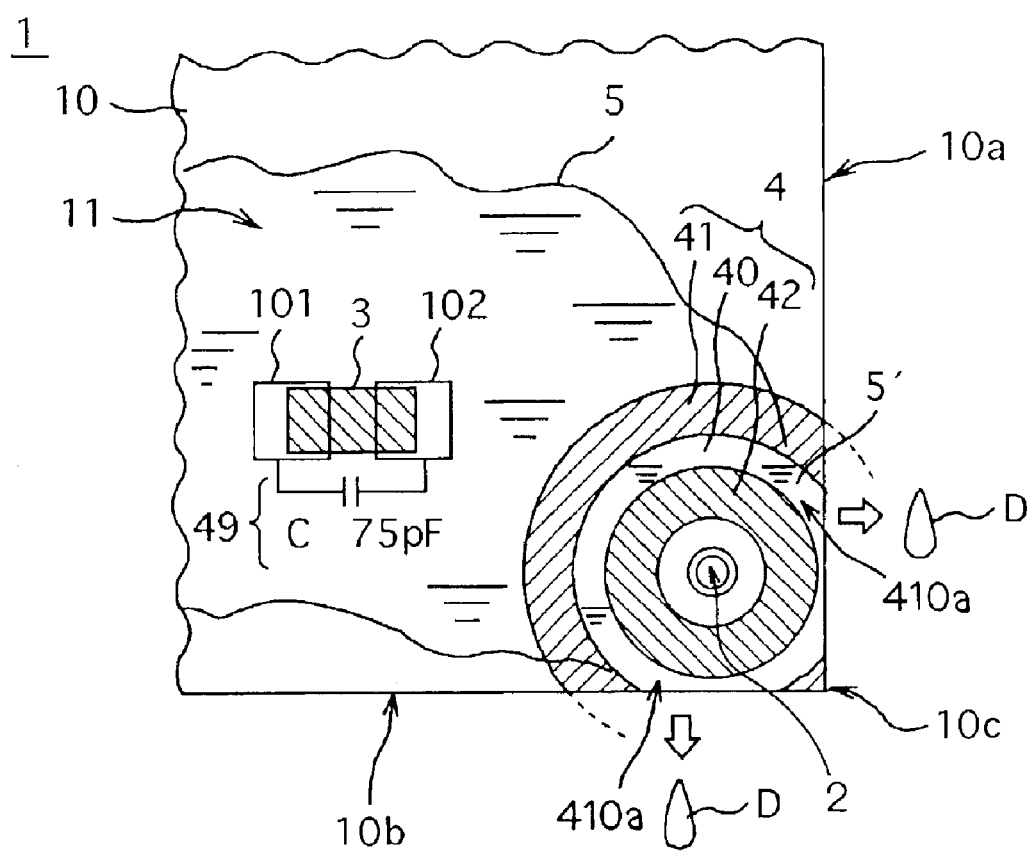
FIG. 9 is a plan view showing a third modified form of the barrier formed on the substrate.

The foregoing embodiment of the present invention may be variously modified. Some examples of modified forms are shown in FIGS. 7–9. In a modified form 1 shown in FIG. 7, two openings 410 are formed in the outer circular bank 41, so that dampproof liquid 5' overflowing into the space 40 can flow out through the openings 410. The openings 410 are formed at positions not facing the chip-capacitor 3 on which the dampproof liquid 5 is coated. In other words, the openings 410 are formed at positions opposite to a position where the chip-capacitor 3 is mounted. The dampproof liquid 5 flowing out through the openings 410 spreads outside the outer bank 41 and stays there as dampproof liquid 5". Therefore, the dampproof liquid 5' in the space 60 does not flow over the inner bank 42, and the through-hole 2 is further surely protected from contamination with the dampproof liquid. The number of the openings 410 may be variously chosen according to a specific design of the printed circuit board 1.

In a case where the through-hole 2 is positioned close to an edge 10a of the substrate 10, the barrier 4 can be modified to a form shown in FIG. 8 (referred to as a modified form 2). The outer circular bank 41 terminates at the edge 10a, thereby forming openings 410a at the edge 10a. A portion of the inner circular bank 42 is also cut by the edge 10a, but the through-hole 2 is still protected by the inner circular bank 42. Since the circuit elements including the chip-capacitor 3 are not positioned too close to the edge 10a, the openings 410a do not face the circuit elements. The dampproof liquid 5' that entered into the space 40 easily flows out from the openings 410a and falls down from the edge 10a in a form of droplets D. The dampproof liquid 5' discharged from the openings 410a may flow around the edge 10a and may reach the through-hole 2 from the rear surface of the substrate 10. Therefore, it is preferable to form another barrier protecting the through-hole 2 on the rear surface of the substrate 10.

In a case where the through-hole 2 is formed close to a corner 10c of the substrate, the barrier 4 may be formed in a shape as shown in FIG. 9 (referred to as modified form 3). The outer circular bank 41 terminates at both edges 10a, 10b of the substrate 10, but the through-hole 2 is fully protected by the inner circular bank 42. The dampproof liquid 5' in the space 40 is discharged from the openings 410a in the same manner as in the modified form 2. It is preferable, also in this modified form 3, to form another barrier protecting the through-hole 2 on the rear surface of the substrate 10 for the same reason as in the modified form 2. It is almost impossible for the dampproof liquid 5 to reach the through-hole 2 over the inner circular bank 42. The through-hole 2 is surely protected from contamination with the dampproof liquid 5.

The present invention is not limited to the embodiment and modified forms described above, but it may be variously modified. For example, the double circular banks 41, 42 are not necessary in some applications. A single circular bank may be able to properly protect the through-hole 2. If necessary in a particular application, more than two circular banks may be made. Further, the barrier is not limited to the circular bank or banks surrounding the through-hole 2. In place of such a barrier, a protecting zone made of a material shedding the dampproof liquid (or paste) 5 may be formed between the circuit elements and the through-hole 2. The dampproof liquid 5 is shed by such a protecting zone and is prevented from reaching the through-hole 2. Further, in the case where the double circular banks are formed, it is possible to form a depressed ditch between the banks to retain a larger amount of the dampproof liquid in the ditch.

While the present invention has been shown and described with reference to the foregoing preferred embodiment, it will be apparent to those skilled in the art that changes in form and detail may be made therein without departing from the scope of the invention as defined in the appended claims.

What is claimed is:

1. A printed circuit board comprising:

a substrate, wherein a through-hole is formed in the substrate;

a circuit element mounted on the substrate, wherein the circuit element is spaced from the through-hole;

a coating of water-resistant liquid on the circuit element; and a barrier for preventing the water-resistant liquid from flowing into the through-hole, wherein at least a part of the barrier is located between the circuit element and the through-hole, wherein the barrier is a structure that includes a plurality of circular, coaxial banks, each of which has a predetermined width and a predetermined height, and an outermost of the banks includes at least one opening, which is located generally on an opposite side of the through-hole from the circuit element.

2. A printed circuit board comprising:

a substrate, wherein a through-hole is formed in the substrate;

a circuit element mounted on the substrate, wherein the circuit element is spaced from the through-hole;

a coating of water-resistant liquid on the circuit element; and a barrier for preventing the water-resistant liquid from flowing into the through-hole, wherein at least apart of the barrier is located between the circuit element and the through-hole, wherein the barrier is a wall that projects from the circuit board about the through-hole, wherein the wall has a predetermined height such that the water-resistant liquid is directed around the through-hole by the wall if the water-resistant liquid flows toward the through-hole.

3. A printed circuit board comprising:

a substrate, wherein a through-hole is formed in the substrate;

a circuit element mounted on the substrate, wherein the circuit element is spaced from the through-hole;

a coating of water-resistant liquid on the circuit element; and a barrier for preventing the water-resistant liquid from flowing into the through-hole, wherein at least a part of the barrier is located between the circuit element and the through-hole, wherein the barrier is a wall that projects from the circuit board and surrounds the through-hole, wherein the wall has a predetermined height such that the water-resistant liquid is directed around the through-hole by the wall if the water-resistant liquid flows toward the through-hole.

* * * * *